(12) United States Patent
Hu et al.

(10) Patent No.: US 12,382,783 B2
(45) Date of Patent: Aug. 5, 2025

(54) DISPLAY DEVICE AND METHOD FOR MANUFACTURE THE SAME

(71) Applicants: Hefei BOE Joint Technology Co., Ltd., Anhui (CN); BOE TECHNOLOGY GROUP CO., LTD., Beijing (CN)

(72) Inventors: Yue Hu, Beijing (CN); Koji Hanawa, Beijing (CN); Dacheng Zhang, Beijing (CN); Meixiu Zhang, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 400 days.

(21) Appl. No.: 17/907,089

(22) PCT Filed: Nov. 15, 2021

(86) PCT No.: PCT/CN2021/130565
§ 371 (c)(1),
(2) Date: Sep. 22, 2022

(87) PCT Pub. No.: WO2022/247158
PCT Pub. Date: Dec. 1, 2022

(65) Prior Publication Data
US 2023/0146536 A1    May 11, 2023

(30) Foreign Application Priority Data
May 27, 2021    (CN) .......................... 202110586557.8

(51) Int. Cl.
*H10K 50/17*    (2023.01)
*H10K 50/826*    (2023.01)
(Continued)

(52) U.S. Cl.
CPC ......... *H10K 50/171* (2023.02); *H10K 50/826* (2023.02); *H10K 59/80* (2023.02);
(Continued)

(58) Field of Classification Search
None
See application file for complete search history.

(56) References Cited

U.S. PATENT DOCUMENTS

2024/0373664 A1* 11/2024 Jia ........................ H10K 59/122

FOREIGN PATENT DOCUMENTS

CN    102544384 A    7/2012
CN    111162184 A    5/2020
(Continued)

OTHER PUBLICATIONS

Second Office Action mailed Jun. 19, 2025 in CN 202110586557.8, with English translation, 20 pages.

*Primary Examiner* — Anthony Ho
(74) *Attorney, Agent, or Firm* — MUNCY, GEISSLER, OLDS & LOWE, P.C.

(57) ABSTRACT

A display device and method for manufacturing the same. The display device includes an anode layer, hole injection layer, hole transport layer, light-emitting material layer, electron transport layer, electron injection layer and cathode layer arranged in sequence. The electron injection layer includes at least one electron injection layer. At least one high impedance layer is further arranged between at least one of the electron injection layers and the cathode layer. The resistivity of the electron injection layer and resistivity of the cathode layer are both smaller than the resistivity of the high impedance layer. The display device and the method for manufacturing the same can solve the problem of short circuit between cathode and anode of the display device caused by particles, significantly reduce the number of dark spots on the panel of the display device, and improve the panel yield of the display device.

23 Claims, 6 Drawing Sheets

(51) Int. Cl.
    *H10K 59/80*     (2023.01)
    *H10K 71/60*     (2023.01)
    *H10K 85/60*     (2023.01)
    *H10K 50/15*     (2023.01)
    *H10K 50/818*     (2023.01)
    *H10K 101/30*     (2023.01)
    *H10K 101/40*     (2023.01)
    *H10K 102/00*     (2023.01)
    *H10K 102/10*     (2023.01)

(52) U.S. Cl.
    CPC ......... *H10K 71/611* (2023.02); *H10K 85/631* (2023.02); *H10K 85/654* (2023.02); *H10K 85/6565* (2023.02); H10K 50/15 (2023.02); H10K 50/818 (2023.02); H10K 2101/30 (2023.02); H10K 2101/40 (2023.02); H10K 2102/103 (2023.02); H10K 2102/351 (2023.02)

(56) References Cited

FOREIGN PATENT DOCUMENTS

| | | |
|---|---|---|
| JP | 2012049085 A | 3/2012 |
| JP | WO2011093146 A1 | 5/2013 |
| WO | WO2006080315 A1 | 8/2006 |

\* cited by examiner

DISPLAY DEVICE AND METHOD FOR MANUFACTURE THE SAME

CROSS-REFERENCE TO RELATED APPLICATION

This application claims a priority to Chinese Patent Application No. 202110586557.8 filed on May 27, 2021, the disclosures of which are incorporated in their entirety by reference herein.

TECHNICAL FIELD

The present disclosure relates to the field of display technology, in particular, to a display device and a method for manufacture the same.

BACKGROUND

OLED (Organic Light Emitting Diode) is an electroluminescent device with self-luminescence, high light-emitting efficiency, low operating voltage, thinness, flexibility and simple manufacturing process. It is widely used in display lighting and other fields. However, in the related art, in the preparation process of the OLED display device, due to the existence of microscopic particles in the device cavity, it is easy to cause a short circuit in the sub-pixels of the display device, thereby causing the generation of dark spots in the light-emitting area, which greatly affects the display effect.

SUMMARY

The present disclosure provides a display device and method for manufacture the same, which can solve the problem of short circuit between cathode and anode of the display device caused by particles, significantly reduce the number of dark spots on the panel of the display device, and improve the panel yield of the display device.

The technical solutions provided by the embodiments of the present disclosure are as follows.

An embodiment of the present disclosure provides a display device, comprising an anode layer, a hole injection layer, a hole transport layer, a light-emitting material layer, an electron transport layer, an electron injection layer, and a cathode layer arranged in sequence;

wherein the electron injection layer comprises at least one electron injection layer, and at least one high impedance layer is further arranged between at least one of the electron injection layers and the cathode layer, a resistivity of the electron injection layer and a resistivity of the cathode layer are both smaller than a resistivity of the high impedance layer.

Exemplarily, the electron injection layer comprises M layers of the electron injection layer and the high impedance layer comprises N layers of the high impedance layer, both M and N are positive integers greater than or equal to 1, and the M layers of the electron injection layer and the N layers of the high impedance layer are alternately arranged.

Exemplarily, both M and N are greater than or equal to 2 and less than or equal to 10.

Exemplarily, the anode layer is an oxide conductive layer, and the cathode layer is a metal film and/or an oxide conductive layer.

Exemplarily, the anode layer is an indium tin oxide film or an indium zinc oxide film, and the cathode layer is the metal film.

Exemplarily, the anode layer is an indium tin oxide film, and the cathode layer is an indium zinc oxide film.

Exemplarily, the anode layer is an indium tin oxide film, the cathode layer comprises a first cathode layer and a second cathode layer arranged on a side of the first cathode layer away from the anode layer, the first cathode layer is the metal film, the second cathode layer is an indium zinc oxide film, and the high impedance layer is arranged between the light-emitting material layer and the first cathode layer.

Exemplarily, the anode layer is an indium tin oxide film, the cathode layer comprises a first cathode layer and a second cathode layer arranged on a side of the first cathode layer away from the anode layer, the first cathode layer is the metal film, the second cathode layer is an indium zinc oxide film, and the high impedance layer is arranged between the first cathode layer and the second cathode layer.

Exemplarily, a value range of the resistivity of the high impedance layer is $1.0 \times 10^5$ Ω·cm~$9.0 \times 10^6$ Ω·cm.

Exemplarily, a value range of a film thickness of the high impedance layer is 60~690 nm.

Exemplarily, an absolute value range of a work function of the high impedance layer is 3.6 eV~4.5 eV.

Exemplarily, a value range of the resistivity of the electron injection layer is $1.0 \times 10^5$ Ω·cm~$9.0 \times 10^5$ Ω·cm.

Exemplarily, an absolute value range of a work function of the electron injection layer is 2.6~4.3 eV.

Exemplarily, a material of the high impedance layer is selected from at least one of zinc oxide, titanium oxide, tin oxide and indium oxide.

Exemplarily, the anode layer comprises a reflective anode layer and a transparent anode layer, and the reflective anode layer is arranged on a side of the transparent anode layer away from the cathode layer.

Exemplarily, the high impedance layer is an amorphous film, with a refractive index of 1.7~2.5, an absorption coefficient lower than 0.02, and a stress of −200~0 MPa.

Exemplarily, the hole transport layer comprises a p-type organic semiconductor material, which is an ink prepared using an aromatic amine compound, and comprises one or a mixture of two selected from materials as follows and materials obtained by changing and optimizing a substituent of the materials as follows:

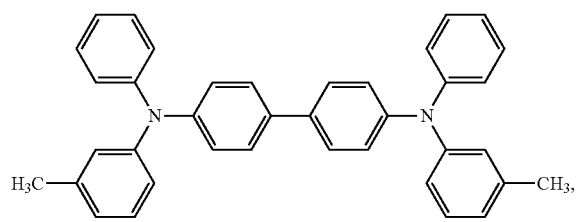

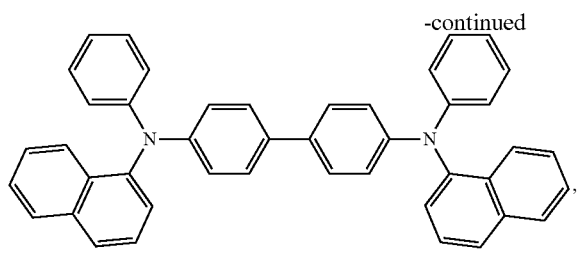
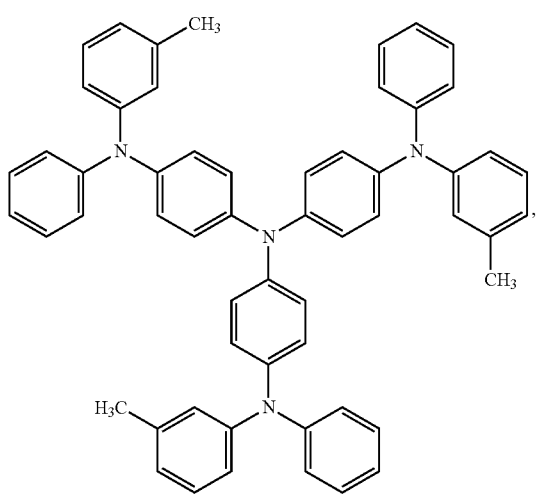
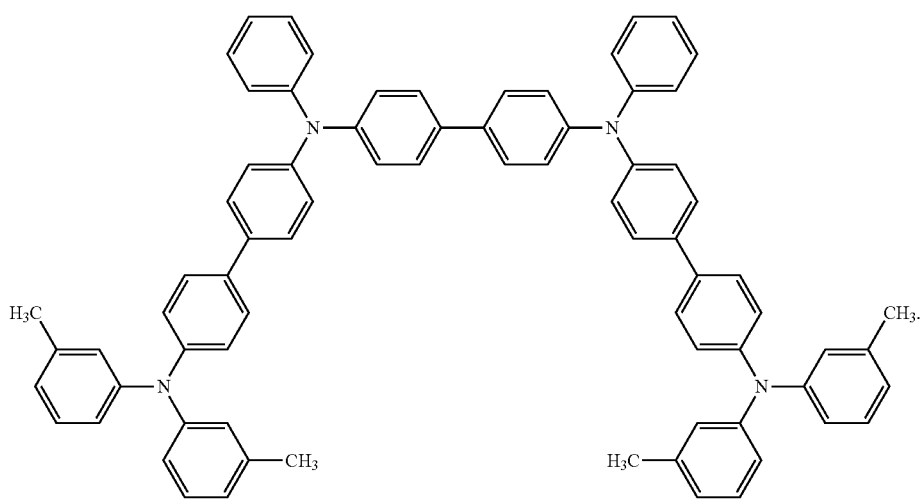
TPTE
Exemplarily, the electron injection layer comprises an n-type organic semiconductor material, which comprises one or a mixture of two selected from materials as follows and materials obtained by changing and optimizing a substituent of the materials as follows:
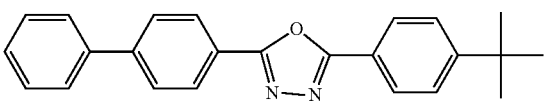

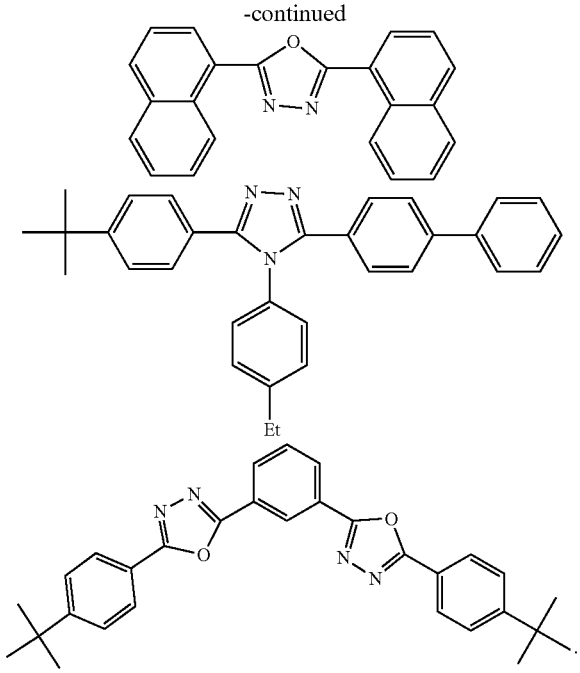

An embodiment of the present disclosure provides method for manufacturing the display device described above, comprising the following steps:
providing a base substrate; and
forming the anode layer, the hole injection layer, the hole transport layer, the light-emitting material layer, the electron transport layer, the electron injection layer, the high impedance layer and the cathode layer in sequence on the base substrate,
wherein at least one electron injection layer is arranged, at least one high impedance layer is further arranged between at least one of the electron injection layers and the cathode layer, and the resistivity of the electron injection layer and the resistivity of the cathode layer are both smaller than the resistivity of the high impedance layer.

Exemplarily, in the method described above, the high impedance layer is formed by sputtering, and a sputtering gas used in the sputtering is oxygen gas and argon gas, and a proportion of the oxygen gas in the sputtering gas is less than or equal to 10%.

Exemplarily, the display device comprises a plurality of pixel units, the pixel units comprise a first sub-pixel, a second sub-pixel and a third sub-pixel;
forming the hole injection layer comprises the following steps:
printing a first hole injection layer in the first sub-pixel, a second hole injection layer in the second sub-pixel, a third hole injection layer in the third sub-pixel in sequence by inkjet printing, wherein the first hole injection layer, the second hole injection layer and the third hole injection layer are printed with the same ink or different inks; and performing vacuum drying and baking treatments on the first hole injection layer, the second hole injection layer and the third hole injection layer after the inkjet printing is completed;
or
printing a first hole injection layer arranged in the first sub-pixel by inkjet printing, and performing vacuum drying and baking treatments on the first hole injection layer, of which a baking temperature is a first temperature;
print a second hole injection layer arranged in the second sub-pixel by inkjet printing, and performing the vacuum drying and baking treatments on the second hole injection layer, of which a baking temperature is a second temperature;
printing a third hole injection layer arranged in the third sub-pixel by inkjet printing, and performing the vacuum drying and baking treatments on the third hole injection layer, of which a baking temperature is a third temperature;
wherein the first hole injection layer, the second hole injection layer and the third hole injection layer are printed with different inks, and the first temperature is higher than the second temperature, and the second temperature is higher than the third temperature.

Exemplarily, the display device comprises a plurality of pixel units, the pixel units comprise a first sub-pixel, a second sub-pixel and a third sub-pixel;
forming the hole transport layer comprises the following steps:
printing a first hole transport layer in the first sub-pixel, a second hole transport layer in the second sub-pixel and a third hole transport layer in the third sub-pixel in sequence by inkjet printing, wherein the first hole transport layer, the second hole transport layer and the third hole transport layer are printed with the same ink or different inks; and performing vacuum drying and baking treatments on the first hole transport layer, the second hole transport layer and the third hole transport layer after the inkjet printing is completed;
or
printing a first hole transport layer arranged in the first sub-pixel by inkjet printing, and performing vacuum drying and baking treatments on the first hole transport layer, of which a baking temperature is a fourth temperature;
printing a second hole transport layer arranged in the second sub-pixel by inkjet printing, and performing the vacuum drying and baking treatments on the second hole transport layer, of which a baking temperature is a fifth temperature;
printing a third hole transport layer arranged in the third sub-pixel by inkjet printing, and performing the vacuum drying and baking treatments on the third hole transport layer, of which a baking temperature is a sixth temperature;
wherein the first hole transport layer, the second hole transport layer and the third hole transport layer are printed with different inks, the fourth temperature is higher than the fifth temperature, and the fifth temperature is higher than the sixth temperature.

Exemplarily, the display device comprises a plurality of pixel units, the pixel units comprise a first sub-pixel, a second sub-pixel and a third sub-pixel;
forming the light-emitting material layer comprises the following steps:
printing a first light-emitting material layer in the first sub-pixel, a second light-emitting material layer in the second sub-pixel and a third light-emitting material layer in the third sub-pixel in sequence by inkjet printing, wherein the first light-emitting material layer, the second light-emitting material layer and the third light-emitting material layer are printed with the same ink or different inks; and performing vacuum drying and baking treatments on the first light-emitting material layer, the second light-emitting material layer and the third light-emitting material layer after the inkjet printing is completed;

or printing a first light-emitting material layer arranged in the first sub-pixel by inkjet printing, and performing vacuum drying and baking treatments on the first light-emitting material layer, of which a baking temperature is a seventh temperature;

printing a second light-emitting material layer arranged in the second sub-pixel by inkjet printing, and performing the vacuum drying and baking treatments on the second light-emitting material layer, of which a baking temperature is a eighth temperature;

printing a third light-emitting material layer arranged in the third sub-pixel by inkjet printing, and performing the vacuum drying and baking treatments on the third light-emitting material layer, of which a baking temperature is a ninth temperature;

wherein the first light-emitting material layer, the second light-emitting material layer and the third light-emitting material layer are printed with different inks, the seventh temperature is higher than the eighth temperature, and the eighth temperature is higher than the ninth temperature.

The beneficial effects brought by the embodiments of the present disclosure are as follows.

In the display device and the method for manufacturing the same provided by the embodiments of the present disclosure, by adding at least one high impedance layer in the structure of the display device, the resistivity of the high impedance layer is higher than that of the adjacent film layers, that is, the resistivity of the high impedance layer is higher than that of the electron injection layer and the cathode layer, and the high impedance layer can modify the surrounding of the particles in the sub-pixels, thereby the problem of short circuit issue between the cathode and anode of the display device caused by the particles is well solved, the number of panel dark spots of the display device is significantly reduced, and the panel yield of the display device is improved.

DETAILED DESCRIPTION

In order to make the purposes, technical solutions and advantages of the embodiments of the present disclosure clearer, the technical solutions of the embodiments of the present disclosure will be clearly and completely described below with reference to the accompanying drawings of the embodiments of the present disclosure. Obviously, the described embodiments are some, but not all, embodiments of the present disclosure. Based on the described embodiments of the present disclosure, all other embodiments obtained by those of ordinary skill in the art without creative efforts fall within the protection scope of the present disclosure.

Unless otherwise defined, technical or scientific terms used in this disclosure shall have the ordinary meaning as understood by one of ordinary skill in the art to which this disclosure belongs. As used in this disclosure, "first" "second" and similar terms do not denote any order, quantity, or importance, but are merely used to distinguish the various components. Likewise, words such as "a" "an" or "the" do not denote a limitation of quantity, but rather denote the presence of at least one. "Comprise" or "include" and similar words mean that the elements or things appearing before the word encompass the elements or things recited after the word and their equivalents, but do not exclude other elements or things. Words like "linked" or "connected" are not limited to physical or mechanical connections, but may include electrical connections, whether direct or indirect. "Up", "Down", "Left", "Right", etc. are merely used to represent the relative positional relationship, and when the absolute position of the described object changes, the relative positional relationship may also change accordingly.

Before giving a detailed description of the display device and the method for manufacturing the same provided in this disclosed embodiment, it is necessary to make the following statements about the related art.

In the related art, taking an OLED display device as an example, in the preparation process of the display device, due to the existence of microscopic particles in the device cavity, it is easy to cause a short circuit in the sub-pixels of the display device, thereby causing the generation of dark spots in the panel light-emitting area of the display device, which greatly affects the display effect.

In order to solve the above problems, the embodiments of the present disclosure provide a display device and a method for manufacturing the same, which can solve the problem of short circuit between cathode and anode of the display device caused by particles, significantly reduce the number of dark spots on the panel of the display device, and improve the panel yield of the display device.

Figure 1:
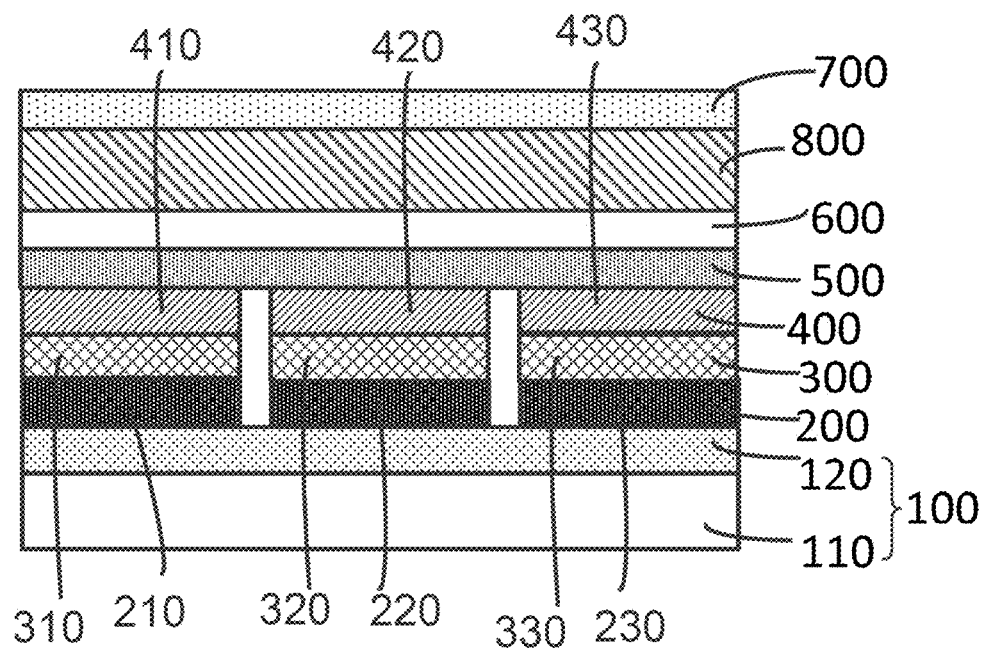
FIG. 1 is a schematic view showing a structure of display device according to an embodiment of the present disclosure.
Figure 3:
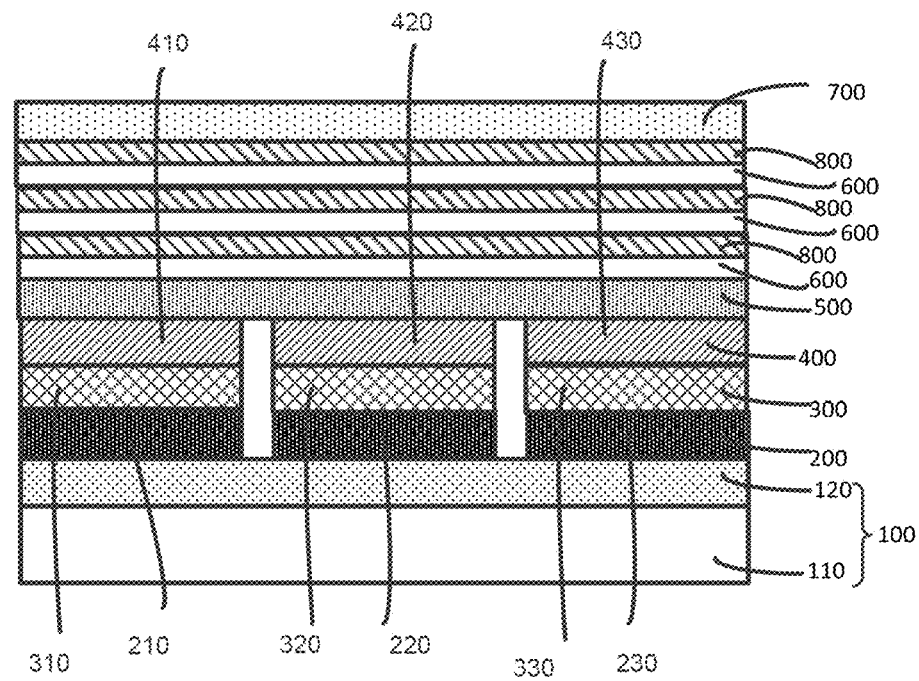
FIG. 3 is a schematic view showing a structure of the display device according to another embodiment of the present disclosure.
Figure 5:
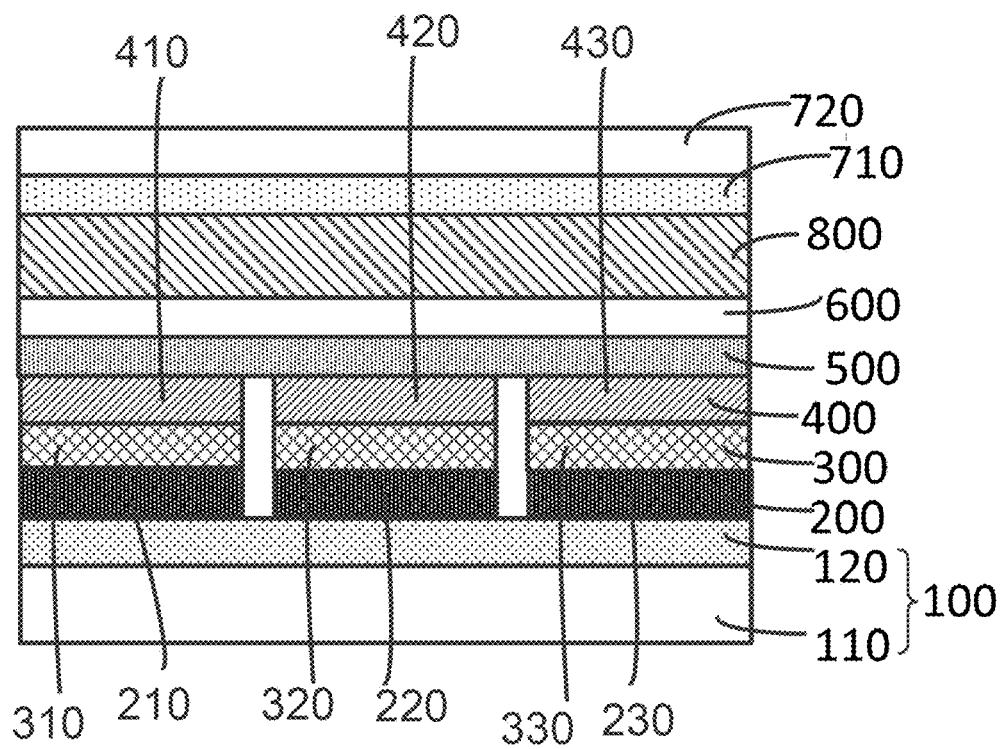
FIG. 5 is a schematic view showing a structure of a display device according to a still another embodiment of the present disclosure.

As shown in FIG. 1, FIG. 3 and FIG. 5, the display device provided by the embodiment of the present disclosure includes the anode layer 100, the hole injection layer 200, the hole transport layer 300, the light-emitting material layer 400, and the electron transport layer 500, the electron injection layer 600 and the cathode layer 700 arranged in sequence; wherein the electron injection layer 600 comprises at least one electron injection layer, and at least one high impedance layer 800 is further arranged between at least one of the electron injection layer 600 and the cathode layer 700, the resistivity of the electron injection layer 600 and the resistivity of the cathode layer 700 are both smaller than the resistivity of the high impedance layer 800.

According to the display device provided by an embodiment of the present disclosure, by adding at least one high impedance layer 800 in the structure of the display device, the resistivity of the high impedance layer 800 is higher than that of the adjacent film layers, that is, the resistivity of the high impedance layer 800 is higher than the resistivity of the electron injection layer 600 and the cathode layer 700, and the high impedance layer 800 can modify the surrounding of the particles in the sub-pixels, thereby, the problem of short circuit between cathode and anode of display device caused by particles is well solved; the number of panel dark spots of the display device is significantly reduced, and the panel yield of the display device is improved.

The display device provided by the embodiments of the present disclosure may be an OLED display device, an MOLED display device, a QLED display device or an MQLED display device, or the like.

A conventional OLED display device includes the anode layer 100, the hole injection layer 200, the hole transport layer 300, the light-emitting material layer 400, the electron transport layer 500, the electron injection layer 600 and the cathode layer 700, which are arranged in sequence. In the display device provided by the embodiment of the present disclosure, at least one high impedance layer 800 is added in the structure of the display device, and the resistivity of the high impedance layer 800 is higher than that of the adjacent film layers, that is, the resistivity of the high impedance layer 800 is higher than the resistivity of the electron injection layer 600 and the cathode layer 700, and the high impedance layer 800 can modify the surrounding of the particles in the sub-pixels, thereby, the problem of short circuit between cathode and anode of display device caused by particles is well solved, the number of panel dark spots of the display device is significantly reduced, and the panel yield of the display device is improved.

In some exemplary embodiments, the value range of the resistivity of the high impedance layer 800 is $1.0 \times 10^5$ $\Omega \cdot cm \sim 9.0 \times 10^6$ $\Omega \cdot cm$; the value range of the film thickness of the high impedance layer 800 is 60~690 nm; the absolute value range of the work function of the high impedance layer 800 can be selected 3.6 eV~4.5 eV.

As some exemplary embodiments, the material of the high impedance layer 800 may be selected from at least one of zinc oxide (ZnO), titanium oxide ($TiO_2$), tin oxide ($SnO_2$) and indium oxide ($In_2O_3$). The high impedance layer 800 can be formed by sputtering, and the sputtering gas can be selected from oxygen and argon. The specific sputtering process can be adjusted according to the specific structure of the display device, for example, in some embodiments, the sputtering gas includes oxygen gas and argon gas, and the proportion of the oxygen gas in the sputtering gas is less than or equal to 10%. Of course, it should be appreciated that the above is only an example, and in practical applications, the material of the high impedance layer 800 is not limited to this.

Specific embodiments of the display device provided by the embodiments of the present disclosure are exemplarily described below.

FIG. 1 is a schematic structural diagram of some specific embodiments of the display device provided by the present disclosure.

As shown in FIG. 1, in some embodiments according to the present disclosure, the display device specifically includes the anode layer 100, the hole injection layer 200, the hole transport layer 300, the light-emitting material layer 400, the electron transport layer 500, the electron injection layer 600, the high impedance layer 800 and the cathode layer 700 arranged in sequence, wherein only one electron injection layer 600 is arranged, and only one high impedance layer 800 is arranged.

In an exemplary embodiment of the present disclosure, as shown in FIG. 1, the anode layer 100 may include a reflective anode layer 110 and a transparent anode layer 120. The reflective anode layer 110 is arranged on the side of the transparent anode layer 120 away from the cathode layer 700, the transparent anode layer 120 may select an ITO layer (indium tin oxide layer), which is formed by a sputtering process.

Furthermore, in an exemplary embodiment of the present disclosure, the display device includes a plurality of pixel units, and the pixel units include a first sub-pixel, a second sub-pixel, and a third sub-pixel.

The hole injection layer 200 includes the first hole injection layer 210, the second hole injection layer 220 and the third hole injection layer 230. The first hole injection layer 210, the second hole injection layer 220 and the third hole injection layer 230 are arranged in the same layer, and the first hole injection layer 210 is arranged in the first sub-pixel, the second hole injection layer 220 is arranged in the second sub-pixel, the third hole injection layer 230 is arranged in the third sub-pixel.

The hole transport layer 300 includes the first hole transport layer 310, the second hole transport layer 320 and the third hole transport layer 330. The first hole transport layer 310, the second hole transport layer 320 and the third hole transport layer 330 are arranged in the same layer, and the first hole transport layer 310 is arranged in the first sub-pixel, and the second hole transport layer 320 is arranged in the second sub-pixel, the third hole transport layer 330 is arranged in the third sub-pixel.

The light-emitting material layer 400 includes a first light-emitting material layer 410, a second light-emitting material layer 420 and a third light-emitting material layer 430. The first light-emitting material layer 410 is arranged in the first sub-pixel, the second light-emitting material layer 420 is arranged in the second sub-pixel, and the third light-emitting material layer 430 is arranged in the third sub-pixel.

The electron transport layer 500 and the electron injection layer 600 are both integral film layers.

In the above solution, the hole transport layer 300, the hole injection layer 200 and the light-emitting material layer 400 may be inkjet printing film layer formed by inkjet printing; the electron transport layer 500 and the electron injection layer 600 may be vapor deposition layer formed by vapor deposition.

Specifically, the forming process of the hole injection layer 200 may be as follows.

The first hole injection layer 210 in the first sub-pixel, the second hole injection layer 220 in the second sub-pixel, and the third hole injection layer 230 in the third sub-pixel are printed in sequence by inkjet printing, wherein the first hole injection layer 210, the second hole injection layer 220 and the third hole injection layer 230 are printed with the same ink or different inks; vacuum drying and baking treatments are performed on the first hole injection layer 210, the second hole injection layer 220 and the third hole injection layer 230 after the inkjet printing is completed.

In the above solution, the same ink can be used for the first hole injection layer 210, the second hole injection layer 220 and the third hole injection layer 230, alternatively, different inks can be selected according to structural differences and the subsequent treating conditions (such as baking temperature) of different inks are the same. After full-screen inkjet printing of the three sub-pixels is completed, VCD vacuum drying can be performed uniformly, and then baking is performed. The inkjet printing sequence of the hole injection layer 200 of the three sub-pixels can be changed without strict limitation.

Of course, it should be appreciated that, according to structural differences, when different inks are used for the first hole injection layer 210, the second hole injection layer 220 and the third hole injection layer 230, when the subsequent treating conditions (such as baking temperature) of different inks are different, the specific production process can further be as follows.

The first hole injection layer 210 in the first sub-pixel is printed by inkjet printing, and vacuum drying and baking treatments are performed on the first hole injection layer 210, and the baking temperature is the first temperature.

The second hole injection layer 220 in the second sub-pixel is printed by inkjet printing, and vacuum drying and baking treatments are performed on the second hole injection layer 220, and the baking temperature is the second temperature.

The third hole injection layer 230 in the third sub-pixel is printed by inkjet printing, and vacuum drying and baking treatments are performed on the third hole injection layer 230, and the baking temperature is the third temperature.

The first temperature is greater than the second temperature, and the second temperature is greater than the third temperature.

In other words, forming of the first hole injection layer 210, the second hole injection layer 220 and the third hole injection layer 230 can be adjusted according to the high or low of baking temperature of the ink, the first hole injection layer 210 with high baking temperature is printed first, and after the printing is completed, VCD vacuum treatment and high temperature baking are performed; after that, the second hole injection layer 220 with the next high baking temperature is printed, and the VCD vacuum treatment and baking treatment are performed; finally, the third hole injection layer 230 with the lowest baking temperature is printed, and corresponding VCD vacuum treatment and baking treatment are performed.

In addition, exemplary, the forming process of the hole transport layer 300 may be as follows.

The first hole transport layer 310 in the first sub-pixel, the second hole transport layer 320 in the second sub-pixel and the third hole transport layer 330 in the third sub-pixel are printed in sequence by inkjet printing, wherein the first hole transport layer 310, the second hole transport layer 320 and the third hole transport layer 330 are printed with the same ink or different inks; vacuum drying and baking treatment are performed on the first hole transport layer 310, the second hole transport layer 320 and the third hole transport layer 330 after the inkjet printing is completed.

In the above solution, the same ink can be used for the first hole transport layer 310, the second hole transport layer 320 and the third hole transport layer 330, alternatively, different inks can be selected according to structural differences and the subsequent treating conditions (such as baking temperature) of different inks are the same. After full-screen inkjet printing of the three sub-pixels is completed, VCD vacuum drying can be performed uniformly, and then baking is performed. The inkjet printing sequence of the hole transport layer 300 of the three sub-pixels can be changed without strict limitation.

Of course, it should be appreciated that, according to structural differences, when different inks are used for the first hole transport layer 310, the second hole transport layer 320 and the third hole transport layer 330, and the subsequent treating conditions (such as baking temperature) of different inks are different, the specific production process can also be as follows.

The first hole transport layer 310 in the first sub-pixel is printed by inkjet printing, and vacuum drying and baking of the first hole transport layer 310 are performed, and the baking temperature is the fourth temperature.

The second hole transport layer 320 in the second sub-pixel is printed by inkjet printing, and vacuum drying and baking of the second hole transport layer 320 are performed, and the baking temperature is the fifth temperature.

The third hole transport layer 330 in the third sub-pixel is printed by inkjet printing, and vacuum drying and baking of the third hole transport layer 330 are performed, and the baking temperature is the sixth temperature.

The fourth temperature is higher than the fifth temperature, and the fifth temperature is higher than the sixth temperature.

In other words, forming of the first hole transport layer 310, the second hole transport layer 320 and the third hole transport layer 330 can be adjusted according to the high or low of baking temperature of the ink, the first hole transport layer 310 with high baking temperature is printed first, and after the printing is completed, VCD vacuum treatment and high temperature baking are performed; after that, the second hole transport layer 320 with the next high baking temperature is printed, and the VCD vacuum treatment and baking treatment are performed; finally, the third hole transport layer 330 with the lowest baking temperature is printed, and corresponding VCD vacuum treatment and baking treatment are performed.

The hole transport layer 300 comprises a p-type organic semiconductor material, and the specific material can be an ink prepared using an aromatic amine compound, which comprises one or a mixture of two selected from materials as follows and materials obtained by changing and optimizing a substituent of the materials as follows:

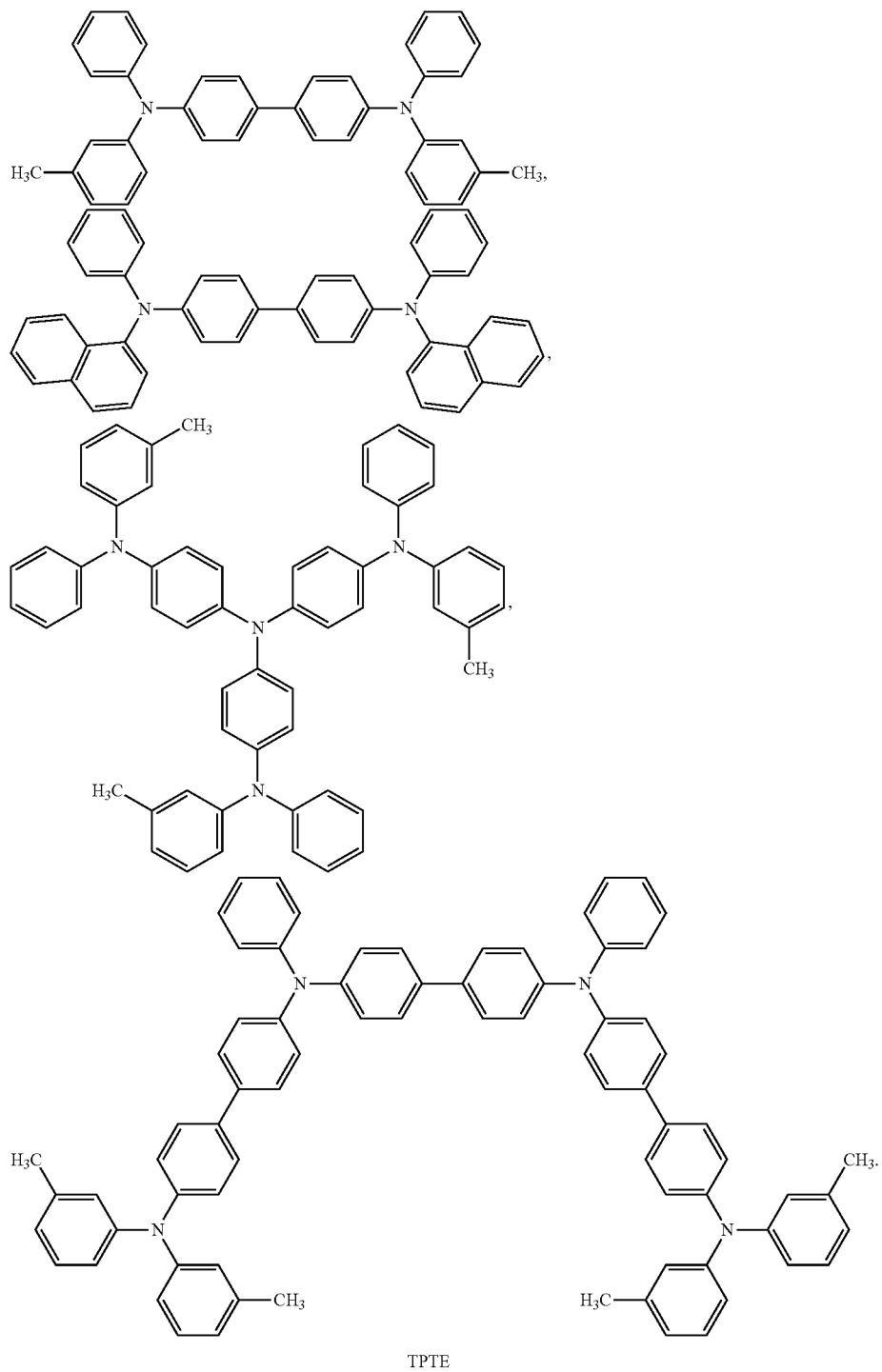

TPTE

Specifically, the manufacturing process of the light-emitting material layer 400 may be as follows.

The first light-emitting material layer 410 in the first sub-pixel, the second light-emitting material layer 420 in the second sub-pixel, the third light-emitting material layer 430 in the third sub-pixel are printed in sequence by inkjet printing, wherein the first light-emitting material layer 410, the second light-emitting material layer 420 and the third light-emitting material layer 430 are printed with the same ink or different inks; vacuum drying and baking treatments are performed on the first light-emitting material layer 410, the second light-emitting material layer 420 and the third light-emitting material layer 430 after inkjet printing is completed.

In the above solution, the same ink can be used for the first light-emitting material layer 410, the second light-emitting material layer 420 and the third light-emitting material layer 430, alternatively, different inks can be selected according to structural differences and the subsequent treating conditions (such as baking temperature) of different inks are the same. After full-screen inkjet printing of the three sub-pixels is completed, VCD vacuum drying can be performed uniformly, and then baking is performed. The inkjet printing sequence of the light-emitting material layer 400 of the three sub-pixels can be changed without strict limitation.

Of course, it should be appreciated that, according to structural differences, when different inks are used for the first light-emitting material layer 410, the second light-emitting material layer 420 and the third light-emitting material layer 430, and the subsequent treating conditions (such as baking temperature) with different inks are different, the specific production process can also be as follows.

The first light-emitting material layer 410 in the first sub-pixel is printed by inkjet printing, and vacuum drying and baking of the first light-emitting material layer 410 are performed, and the baking temperature is the fourth temperature.

The second light-emitting material layer 420 in the second sub-pixel is printed by inkjet printing, and vacuum drying and baking of the second light-emitting material layer 420 are performed, and the baking temperature is the fifth temperature.

The third light-emitting material layer 430 in the third sub-pixel is printed by inkjet printing, and vacuum drying and baking of the third light-emitting material layer 430 are performed, and the baking temperature is the sixth temperature.

The fourth temperature is higher than the fifth temperature, and the fifth temperature is higher than the sixth temperature.

In other words, forming of the first light-emitting material layer 410, the second light-emitting material layer 420 and the third light-emitting material layer 430 can be adjusted according to the high or low of baking temperature of the ink, the first light-emitting material layer 410 with high baking temperature is printed first, and after the printing is completed, VCD vacuum treatment and high temperature baking are performed; after that, the second light-emitting material layer 420 with the next high baking temperature is printed, and the VCD vacuum treatment and baking treatment are performed; finally, the third light-emitting material layer 430 with the lowest baking temperature is printed, and corresponding VCD vacuum treatment and baking treatment are performed.

Specifically, the electron transport layer 500 and the electron injection layer 600 may be formed by an evaporation process, wherein the material resistivity of the electron injection layer 600 is in the range of $1.0 \times 10^5$ Ω·cm~$9.0 \times 10^5$ Ω·cm; the electron injection layer 600 comprises an n-type organic semiconductor material, the specific material may one or a mixture of two selected from materials as follows and materials obtained by changing and optimizing a substituent of the materials as follows:

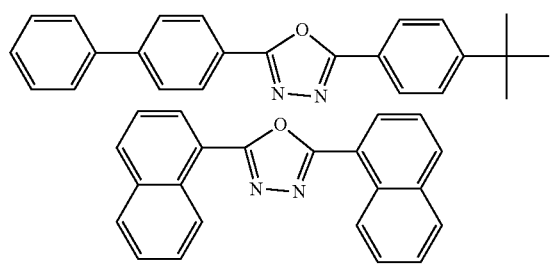

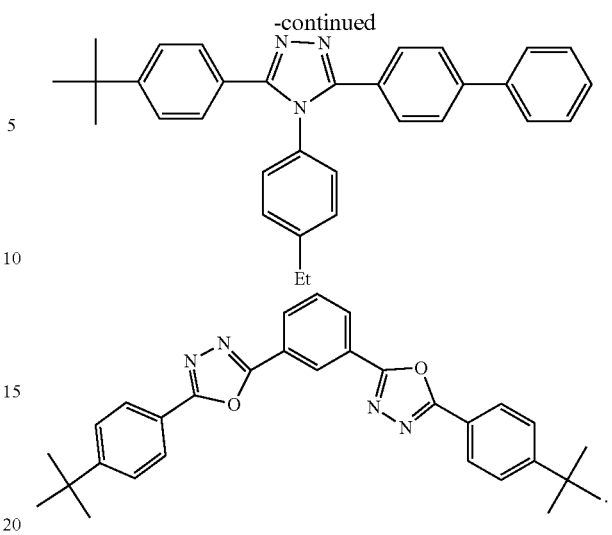

It should be appreciated that the specific selection of material of the electron injection layer 600 above is only an example, and is not limited to this.

In addition, the cathode layer 700 can be specifically formed by an evaporation process, and can be a metal film, such as an Ag or Ag/Mg film layer.

Figure 2:
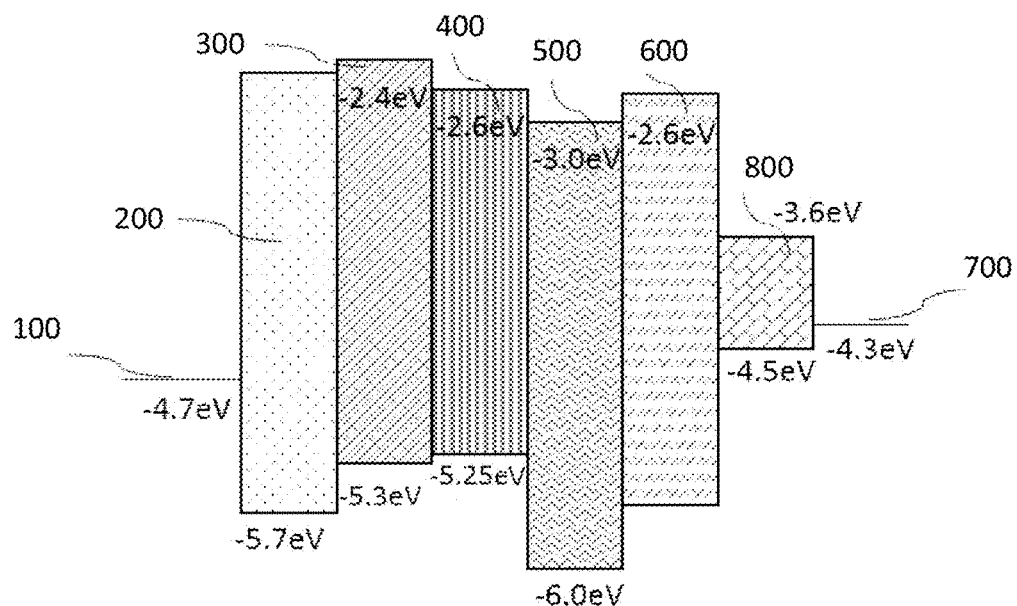
FIG. 2 is an energy level diagram of each film layer in the display device shown in FIG. 1.

Taking the structure of the display device in the embodiment shown in FIG. 1 as an example, the energy level diagram of each film of the display device is shown in FIG. 2, as an exemplary embodiment, the anode layer 100 is made of ITO material, and its work function is 4.7 eV; the work function of the hole injection layer 200 is 5.7 eV; the work function of the hole transport layer 300 is 2.4 eV~5.3 eV; the work function of the light-emitting material layer 400 is 2.6 eV~5.25 eV; the work function of the electron transport layer 500 is 3.0 eV~6.0 eV; the work function of the electron injection layer 600 is 2.6 eV; the work function of the high impedance layer 800 is 3.6~4.5 eV; the cathode layer 700 is made of a metal film, and its work function is 4.3 eV.

It should be appreciated that the above is only an example, and in practical applications, the energy level diagram of each film layer of the display device may not be limited to this.

FIG. 3 is a schematic view showing a structure of other specific embodiments of the display device provided by the present disclosure.

As shown in FIG. 3, in other embodiments provided by the present disclosure, the display device specifically includes the anode layer 100, the hole injection layer 200, the hole transport layer 300, the light-emitting material layer 400, the electron transport layer 500, the electron injection layer 600, the high impedance layer 800 and the cathode layer 700, wherein the electron injection layer 600 comprises M layers of the electron injection layer, the high impedance layer 800 comprises N layers of the high impedance layer, M and N are both positive integers greater than or equal to 1, and the M layers of electron injection layer 600 and the N layers of high impedance layers 800 are alternately arranged.

It should be noted that the numbers of M and N may be the same or different.

The difference between this embodiment and the embodiment shown in FIG. 1 is that the embodiment shown in FIG. 1 includes only one electron injection layer 600 and only one high impedance layer 800. In this embodiment, each electron injection layer 600 and each high impedance layer 800 are alternately arranged, the M layers of electron injection layer 600 and the N layers of high impedance layer 800 are alternately arranged between the electron transport layer 500 and the cathode layer 700. In this way, compared with the embodiment shown in FIG. 1, the film thickness of each electron injection layer 600 and each high impedance layer 800 can be thinner, that is, the electron injection layer 600 and the high impedance layer 800 are formed into thin layers, so that the transition of the work function change between the electron transport layer 500 and the cathode layer 700 is smoother, and is more conducive to the injection and transmission of electrons.

In an exemplary embodiment, M and N are both greater than or equal to 2 and less than or equal to 10, for example, in the embodiment shown in FIG. 3, N is 3. Of course, it should be appreciated that in practical applications, when the film thickness and work function of each film layer in different display device structures are different, the number of N can also be adjusted adaptively, for example, N may also be a positive integer greater than 10, which is not limited.

Figure 4:
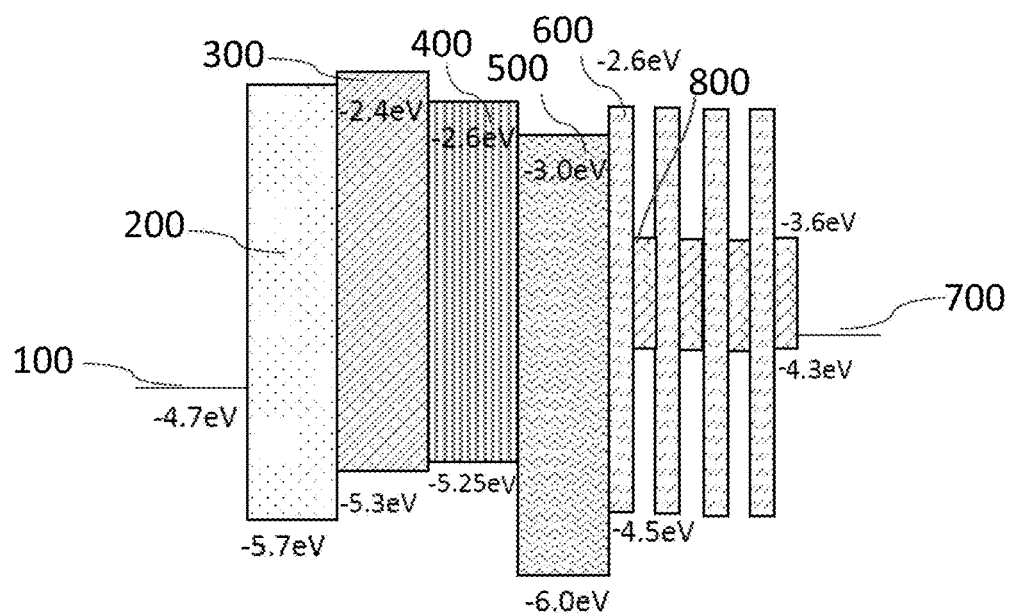
FIG. 4 is an energy level diagram of each film layer in the display device shown in FIG. 3.

Taking the structure of the display device in the embodiment shown in FIG. 3 as an example, the energy level diagram of each film layer of the display device is shown in FIG. 4, as an exemplary embodiment, the anode layer 100 is made of ITO material, and its work function is 4.7 eV; the work function of the hole injection layer 200 is 5.7 eV; the work function of the hole transport layer 300 is 2.4 eV~5.3 eV; the work function of the light-emitting material layer 400 is 2.6 eV~5.25 eV; the work function of the electron transport layer 500 is 3.0 eV~6.0 eV; the work function of the electron injection layer 600 is 2.6 eV~4.5 eV; the work function of the high impedance layer 800 is 3.6~4.3 eV; the work function of the cathode layer 700 is 4.3 eV.

It should be appreciated that the above is only an example, and in practical applications, the energy level diagram of each film layer of the display device may not be limited to this.

In the display device provided by the embodiment of the present disclosure, the anode layer 100 is an oxide conductive layer, and the cathode layer 700 is a metal film and/or an oxide conductive layer.

As an embodiment provided by the present disclosure, the display device may further include the anode layer 100, the hole injection layer 200, the hole transport layer 300, the light-emitting material layer 400, the electron transport layer 500, the electron injection layer 600, the high impedance layer 800 and the cathode layer 700 arranged in sequence, wherein the anode layer 100 is an indium tin oxide film, and the cathode layer 700 is a metal film.

As another embodiment provided by the present disclosure, the display device may further include the anode layer 100, the hole injection layer 200, the hole transport layer 300, the light-emitting material layer 400, the electron transport layer 500, the electron injection layer 600, the high impedance layer 800 and the cathode layer 700 arranged in sequence, wherein the anode layer 100 is an indium tin oxide (ITO) film, and the cathode layer 700 is an indium zinc oxide (IZO) film.

The difference between this embodiment and the embodiment shown in FIG. 1 is that the cathode layer 700 is an indium zinc oxide film. As an exemplary embodiment, the anode layer 100 is made of ITO material, and its work function is 4.7 eV; the work function of the hole injection layer 200 is 5.7 eV; the work function of the hole transport layer 300 is 2.4 eV~5.3 eV; the work function of the light-emitting material layer 400 is 2.6 eV~5.25 eV; the work function of the electron transport layer 500 is 3.0 eV~6.0 eV; the work function of the electron injection layer 600 is 2.6 eV; the work function of the high impedance layer 800 is 3.6~4.5 eV; the cathode layer 700 is an indium zinc oxide (IZO) film, and its work function is 5.0 eV.

It should be appreciated that the above is only an example, and in practical applications, the energy level diagram of each film layer of the display device may not be limited to this.

In this embodiment, compared with the embodiment shown in FIG. 1, the cathode layer 700 uses an indium zinc oxide (IZO) film, which compared with the cathode layer 700 using a metal cathode, the work function of the indium zinc oxide (IZO) film is larger than that of the metal film, which can improve the hole injection rate, and at the same time, the indium zinc oxide (IZO) film has high light transmittance, which can increase the light extraction efficiency.

Among them, the preparation process of IZO film can be magnetron sputtering, pulsed laser deposition (PLD), chemical vapor deposition (CVD), sol-gel deposition, spray thermal decomposition, pulsed plasma deposition (PPD) and so on.

However, when the indium zinc oxide (IZO) film is directly prepared on the electron injection layer 600, the electron injection layer 600 may be damaged due to process limitations and other reasons. Therefore, FIG. 5 is a structural schematic view showing other specific embodiments of a display device according to the present disclosure. Referring to FIG. 5, in other embodiments provided by the present disclosure, the display device specifically includes an anode layer 100, a hole injection layer 200, a hole transport layer 300, a light-emitting material layer 400, an electron transport layer 500, the electron injection layer 600, the high impedance layer 800 and the cathode layer 700 arranged in sequence.

The cathode layer 100 is an indium tin oxide film, and the cathode layer 700 includes the first cathode layer 710 and the second cathode layer 720 arranged on the side of the first cathode layer 710 away from the anode layer, the first cathode layer 710 is a metal film, the second cathode layer 720 is an indium zinc oxide film, and the high impedance layer 800 is arranged between the light-emitting material layer 500 and the first cathode layer 710.

Figure 6:
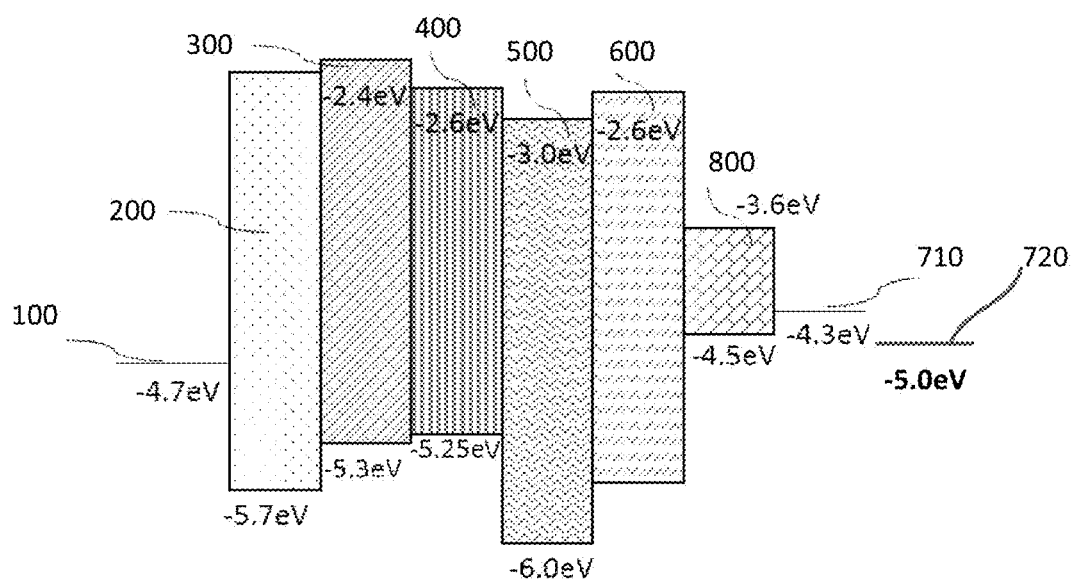
FIG. 6 is an energy level diagram of each film layer in the display device shown in FIG. 5.

The difference between this embodiment and the embodiment shown in FIG. 1 is that the cathode layer 700 adopts a composite film layer of a metal film and an indium zinc oxide film. FIG. 6 shows the energy level diagram of each film layer in the display device in this embodiment, referring to FIG. 6, as an exemplary embodiment, the anode layer 100 is made of ITO material, and its work function is 4.7 eV; the work function of the hole injection layer 200 is 5.7 eV; the work function of the hole transport layer 300 is 2.4 eV~5.3 eV; the work function of the light-emitting material layer 400 is 2.6 eV~5.25 eV; the work function of the electron transport layer 500 is 3.0 eV~6.0 eV; the work function of the electron injection layer 600 is 2.6 eV; the work function of the high impedance layer 800 is 3.6~4.5 eV; the cathode layer 700 is a metal film, and its work function is 4.3 eV; the work function of the indium zinc oxide (IZO) film 720 is 5.0 eV.

It should be appreciated that the above is only an example, and in practical applications, the energy level diagram of each film layer of the display device may not be limited to this.

Compared with the embodiment shown in FIG. 1, the present embodiment is provided with an indium zinc oxide (IZO) film on the side of the metal film away from the anode layer 100, the work function of the indium zinc oxide (IZO) film 720 is higher than that of the metal film, which can improve the hole injection rate. Meanwhile, the indium zinc oxide (IZO) film 720 has high light transmittance, which can increase the light extraction efficiency.

As another embodiment provided by the present disclosure, the display device may also include the anode layer 100, the hole injection layer 200, the hole transport layer 300, the light-emitting material layer 400, the electron transport layer 500, the electron injection layer 600, the high impedance layer 800 and the cathode layer 700 arranged in sequence, wherein the anode layer 100 is an indium zinc oxide (IZO) film and the cathode layer 700 is a metal film.

The difference between the present embodiment and the embodiment shown in the figure is that the anode layer 100 uses an IZO film, and its work function can effectively reduce the hole barrier and improve the hole injection rate.

It should be noted that, the anode layer 100 and the cathode layer 700 cannot be an IZO film at the same time.

Figure 7:
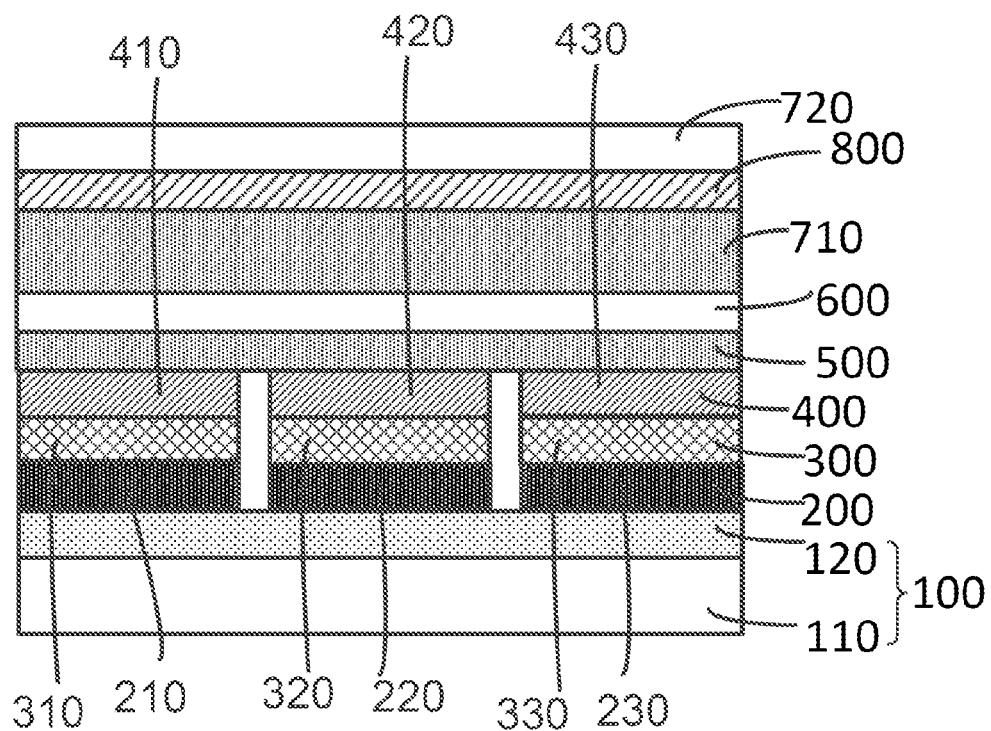
FIG. 7 is a schematic view showing a structure of a display device according to a yet still another embodiment of the present disclosure.

As another embodiment, as shown in FIG. 7, the anode layer 100 is an indium tin oxide film, the cathode layer 700 includes a first cathode layer 710 and a second cathode layer 720 arranged on a side of the first cathode layer 710 away from the anode layer 100, the first cathode layer 710 is a metal film, the second cathode layer 720 is an indium zinc oxide film, and the high impedance layer 800 is arranged between the first cathode layer 710 and the second cathode layer 720.

Figure 8:
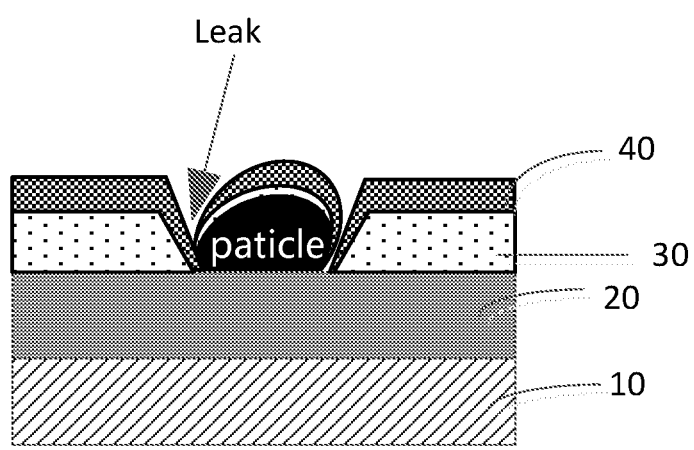
FIG. 8 is a schematic view showing the principle of a short circuit problem caused by particles in a conventional OLED display device.
Figure 9:
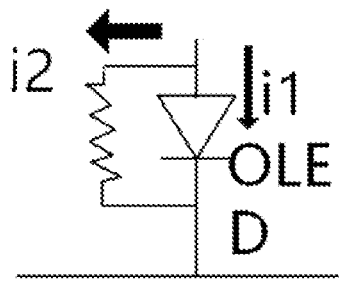
FIG. 9 is a schematic view showing the principle circuit of the short circuit problem caused by particles in a conventional OLED display device.

In order to more clearly illustrate the light-emitting device of the embodiment of the present disclosure, verifications and explanations in more detail are provided below, in combination with the principle, in regards to solving the short circuit problem between the cathode and anode of the display device caused by particles by adding the high impedance layer in the embodiment of the present disclosure, FIG. 8 is a schematic diagram showing the principle of the short circuit problem caused by particles in a conventional OLED display device. The conventional OLED display device includes a substrate 10, an anode layer 20, an organic light-emitting layer 30, and a cathode layer 40. As shown in FIG. 8, since the organic film is not formed around the particles, the anode and the cathode are in contact, resulting in leaking. If the circuit is drawn as shown in FIG. 9, since the leak current is large, no current flows in the OLED, or if the leak current is too large, the OLED will be damaged due to heat generation.

Figure 10:
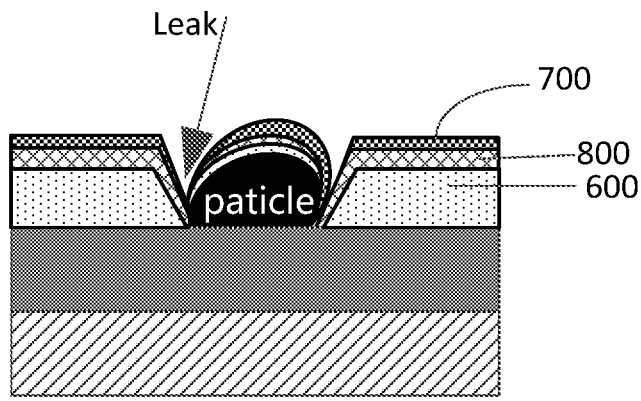
FIG. 10 is a schematic view showing the principle of solving the short circuit problem caused by particles in the display device according to an embodiment of the present disclosure.
Figure 11:
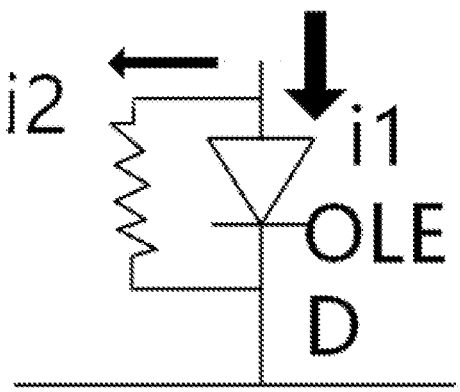
FIG. 11 is a schematic view showing the principle of the short circuit problem caused by particles in the OLED display device according to an embodiment of the present disclosure.

FIG. 10 is a schematic diagram showing the principle of solving the short circuit problem caused by particles in the display device provided by the embodiment of the present disclosure. When there is a high impedance layer between the anode and the cathode, there is a high impedance film in the surrounding part of the particles, the current flowing through the leaking part decreases, and therefore the current flowing through the OLED increases. Drawing in a circuit method, as shown in FIG. 11, a high impedance layer is formed around the particles and leaking is alleviated.

As can be seen from FIG. 8 to FIG. 11 above, the high impedance layer 800 is formed between the electron injection layer 600 and the cathode layer 700, thereby alleviating leaking and short circuit of the anode and the cathode. In addition, the sputtered high impedance layer covers better than the vapor-deposited organic film, because the film will enter into the surrounding part of particles, and the leaking is further alleviated.

In addition, major factors that determines the impedance of the leaking part of the high impedance layer around the particles is represented by the following formula:

$$\text{resistance } (R) = \text{resistivity } (\rho) \times (\text{high impedance layer thickness } (T)/\text{cross-sectional area of high impedance layer } (S)).$$

Among them, it can be seen from the above formula that the factors that determine the impedance of the leaking part of the high impedance layer around the particles mainly include the following factors:

a) Resistivity:

When the resistivity ($\rho$) is increased, the resistance (R) will increase, and the leaking and short circuit will be alleviated. However, the voltage of the device will further be increased, thus the value range of the resistivity ($\rho$) of the high impedance layer can be $1.0 \times 10^5$ Ω·cm~$9.0 \times 10^6$ Ω·cm, and the resistivity is more suitable in this case.

b) Thickness of High Impedance Layer:

Specifically, it includes the following points:

1) The thicker the film thickness of the high impedance layer is, the greater the resistance will be, and the better the improvement effect on the leaking and short circuit will be. However, considering the influence of the film thickness on the thinning of the display device, the film thickness of the high impedance layer can be in the range of 60690 nm. The specific film thickness can be adjusted according to the device structure. In addition, the film thickness of the high impedance layer 800 can also be adjusted according to actual demand, and is not limited to the above-mentioned value range.

2) The better the coverage of the high impedance layer is, the thicker the high impedance layer in the leaking part will be, and the quality of the coverage mainly depends on the film-forming process of the high impedance layer. From the film-forming process, the coverage quality order of the high impedance layer is: ALD (Atomic Layer Deposition)>CVD (Chemical Vapor Deposition)>SPT>EVP, for example, in an embodiment of the present disclosure, an SPT film-forming process can be used to form the high impedance layer.

3) When the particle shape is a positive cone, the high impedance layer can easily wrap the particles, and when the particle shape is inverted cone, the high impedance layer can hardly wrap.

4) Taking the cathode layer comprising the IZO layer as an example, the worse the Coverage of the IZO is, the longer the distance from the leaking part to the IZO layer will be. In some embodiments, the high impedance layer and the IZO layer are film-formed by SPT with equal Coverage.

c) The Cross-Sectional Area of the High Impedance Layer:

The cross-sectional area of the high impedance layer refers to the cross-sectional area of the leaking part; specifically, the following two aspects need to be explained:

1) Particle size: leaking parts are formed around the particles. The larger the particles are, the larger the cross-sectional area of the leaking parts will be. Therefore, although a high impedance layer is added, in practical applications, the particle size should be minimized.

2) Shape of particles: when the particles are in a positive cone shape, the high impedance layer can easily wrap the particles, and when the particles are in an inverted cone shape, the high impedance layer can hardly wrap.

The major factors that determine the impedance of the leaking part of the high impedance layer around the particles have been described above. The following describes the value range of the resistivity value of the high impedance layer, that is, the target value of the resistivity:

The resistivity of the high impedance layer can be determined by current simulation of the OLED reproducing the leaking part. The simulation is performed using the structure of the light-emitting device shown in FIG. 5 as a model. The light-emitting device includes an anode layer 100, a hole injection layer 200, a hole transport layer 300, a light-emitting material layer 400, an electron transport layer 500, an electron injection layer 600, a high impedance layer 800 and a cathode layer 700 arranged in sequence, wherein the cathode layer 700 includes a first cathode layer and a second cathode layer 720 arranged on a side of the first cathode layer away from the anode layer. The first cathode layer 710 is a Mg/Ag metal film, and the second cathode layer is an IZO layer 720, wherein the resistivity of the high impedance layer is around $1.0 \times 10^5$ Ω·cm~$1.0 \times 10^6$ Ω·cm.

Figure 12:
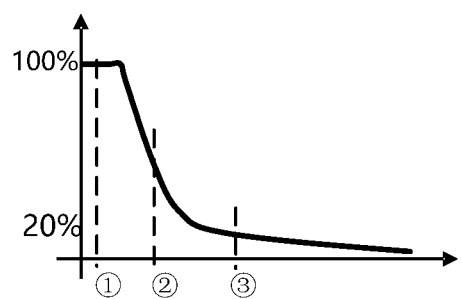
FIG. 12 is a schematic view showing the proportion of the current flowing through the leaking part in the OLED device.
Figure 13:
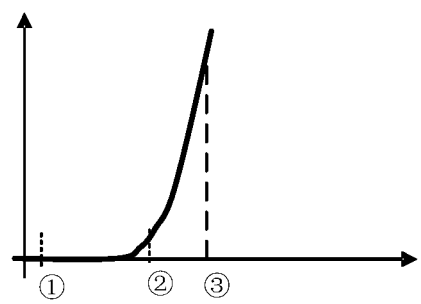
FIG. 13 is a schematic view showing the IV characteristic curve of the OLED light-emitting device.

The resulting schematic diagrams of current simulation are shown in FIG. 12 and FIG. 13, in which FIG. 12 shows the proportion of current flowing in the leaking part of the OLED device, and FIG. 13 shows the IV characteristic curve of the OLED light-emitting device.

As shown by ① in FIG. 12 and FIG. 13, in the extremely low current region, since no current flows in OLED, 100% of the current flows through the leaking part; as shown by ② in FIG. 12 and FIG. 13, when current slightly flows in OLED, the proportion of current flowing through the leaking part decreases; and as shown by ③ in FIG. 12 and FIG. 13, when the resistivity of the high impedance layer is $1.0 \times 10^5$ Ω·cm~$1.0 \times 10^6$ Ω·cm, in the current region where OLED normally emit light, 20% of the current flows through the leaking part. It should be noted that the OLED emits 80% of the light, so dark spots cannot be identified.

It can be seen that under the condition that the resistivity of the high impedance layer is around $1.0 \times 10^5$ Ω·cm~$1.0 \times 10^6$ Ω·cm, about 80% of the current flows in the OLED, and about 20% of the current flows in the leaking part.

In addition, the following descriptions are made for the specifications of the high impedance layer:

In addition, the refractive index n of the high impedance layer is 1.7 to 2.5. This is because the high impedance layer has a refractive index similar to that of the organic layer (refractive index n1=around 1.8), which facilitates optical design. It should be noted that, in practical applications, the specific value of the refractive index n of the high impedance layer is not limited to this. For example, in some structures, the optical design can also be used when n=2.5.

In addition, the absorption coefficient of the high impedance layer <0.02, and the smaller the absorption coefficient is, the better the improvement effect of the leaking part will be.

In addition, the value range of the stress of the high impedance layer is −200~0 MPa.

In addition, in regards to the electron injection property of the high impedance layer, for example, when the high impedance layer is a single-layer film of $1.0 \times 10^5$ Ω·cm~$1.0 \times 10^6$ Ω·cm, the electron injection property is poor. Films extremely thin with resistivity of $1.0 \times 10^3$ Ω·cm~$1.0 \times 10^4$ Ω·cm can be respectively formed on opposite sides of the high impedance layer, the film thickness can be 5~10 nm, and the material can be the same as the material of the high impedance layer. The sputtering process can be used in the film forming process, and the films can be obtained by adjusting the oxygen amount of the sputtering gas in the sputtering process.

In addition, the description about the anti-hydrogen plasma reactivity of the high impedance layer is as follows.

A CVD process is included in the subsequent process of the high impedance layer of the light-emitting device. In the CVD process, hydrogen plasma is generated, the high impedance layer is reduced, and the resistivity will be reduced. Therefore, preferably the material of the high impedance layer is the material with a small amount of decrease in resistivity when influenced by hydrogen plasma.

Table 1 lists several specific materials available for the high impedance layer:

TABLE 1

| Main component | Gas species | Pressure (Pa) | Film-forming power (W/cm2) | Film thickness (nm) | Refractive index λ = 550 nm | Extinction coefficient λ = 405 nm | Resistivity (Ω · cm) |
| --- | --- | --- | --- | --- | --- | --- | --- |
| ZnO | 2% O$_2$ | 0.5 | 5.5 | 225 | 1.89 | 0.000 | 1.5E+4 |
|  | 3% O$_2$ | 0.5 | 5.5 | 207 | 1.91 | 0.000 | 2.9E+6 |
| ZnO | Ar | 0.5 | 2.7 | 690 | 1.90 | 0.06 | 3.2E+5 |
|  | 1% O$_2$ | 0.5 | 2.7 | 750 | 1.83 | 0.000 | 1.4E+9 |
| TiO$_2$ | 1% O$_2$ | 0.5 | 5.5 | 202 | 2.42 | 0.02 | 1.5E+4 |
|  | 2% O$_2$ | 0.5 | 8.2 | 209 | 2.38 | 0.007 | 1.5E+6 |
| SnO$_2$ | 2% O$_2$ | 0.5 | 2.7 | 150 | 1.99 | 0.02 | 2.0E+3 |
|  | 6% O$_2$ | 0.5 | 2.7 | 150 | 1.98 | 0.005 | 1.2E+8 |
| In$_2$O$_3$ | 4% O$_2$ | 0.5 | 2.7 | 60 | 2.00 | 0.000 | 6.1E+4 |
|  | 10% O$_2$ | 0.5 | 2.7 | 60 | 2.00 | 0.000 | 7.7E+10 |

The resistivity of the high impedance layer can be selected around $1.0 \times 10^5$ Ω·cm~$1.0 \times 10^6$ Ω·cm, but it is not limited to this, for example, in order to improve the electron injection property, the high impedance layer may have a film thickness of about 10 nm and the resistivity of about $1.0 \times 10^3$ Ω·cm.

In addition, the high impedance layer is preferably an amorphous film, because the resistivity of each crystal of the crystalline film is different, and therefore, a homogeneous amorphous film is more effective.

It should be noted that the film formation process of the above materials is sputtering process. As the proportion of oxygen in the sputtering gas increases, the film formation power decreases, and the resistivity of the formed film layer increases.

The following two specific materials are used as high impedance layers in light emitting devices to conduct confirmatory tests, and the results are shown in Table 2:

TABLE 2

| Main component | Sample Serial No. | Film forming conditions | | | | Resistivity ($\Omega \cdot cm$) reference value | Power function(eV) | |
| --- | --- | --- | --- | --- | --- | --- | --- | --- |
| | | Gas species | Gas Pressure (Pa) | Power Density (w/cm2) | Film thickness (nn) | | 1st measurement | 2nd measurement |
| ZnO | sample 1 | 2% $O_2$ | 0.5 | 5.5 | 225 | 1.50E+04 | 5.44 | — |
| | sample 2 | 3% $O_2$ | 0.5 | 5.5 | 207 | 2.90E+06 | 5.52 | 5.55 |
| | sample 3 | 2% $O_2$ | 0.5 | 4.1 | 201 | 7.20E+07 | 5.44 | — |
| $TiO_2$ | sample 4 | 1% $O_2$ | 0.5 | 5.5 | 202 | 1.50E+04 | 5.24 | — |
| | sample 5 | 2% $O_2$ | 0.5 | 8.2 | 209 | 1.50E+06 | 5.31 | — |
| | sample 6 | 2% $O_2$ | 0.5 | 5.5 | 182 | 1.60E+09 | 5.60 | — |

In addition, an embodiment of the present disclosure further provides a method for manufacturing a display device, which is used for manufacturing the display device provided by the embodiment of the present disclosure, and the method includes the following steps:

Step S01, providing a base substrate;

Step S02, forming the anode layer 100, the hole injection layer 200, the hole transport layer 300, the light-emitting material layer 400, the electron transport layer 500, the electron injection layer 600, the high impedance layer 800, and the cathode layer 700 in sequence on the base substrate, wherein at least one electron injection layer 600 is arranged, at least one high impedance layer 800 is further arranged between at least one of the electron injection layers 600 and the cathode layer 700. The resistivity of the electron injection layer 600 and the cathode layer 700 are both smaller than the resistivity of the high impedance layer 800.

Exemplarily, in the method, the high impedance layer 800 is formed by sputtering process, and the sputtering gas used in the sputtering process is oxygen gas and argon gas. The proportion of the oxygen gas in the sputtering gas is less than or equal to 10%.

Exemplarily, the display device includes a plurality of pixel units, the pixel units include the first sub-pixel, the second sub-pixel and the third sub-pixel;

In the method, in step S02, the hole transport layer 300, the hole injection layer 200 and the light-emitting material layer 400 may be inkjet printing film layers formed by inkjet printing; the electron transport layer 500 and the electron injection layer 600 may be vapor deposition film layers formed by vapor deposition.

Specifically, the forming process of the hole injection layer 200 may be as follows.

The first hole injection layer 210 in the first sub-pixel, the second hole injection layer 220 in the second sub-pixel, and the third hole injection layer 230 in the third sub-pixel are printed in sequence by inkjet printing, wherein the first hole injection layer 210, the second hole injection layer 220 and the third hole injection layer 230 are printed with the same ink or different inks; the first hole injection layer 210, the second hole injection layer 220 and the third hole injection layer 230 after the inkjet printing is completed are subjected to vacuum drying and baking treatment.

In the above solution, the same ink may be used for the first hole injection layer 210, the second hole injection layer 220 and the third hole injection layer 230, alternatively, different inks can be selected according to structural differences and the subsequent treating conditions (such as baking temperature) of different inks are the same. After full-screen inkjet printing of the three sub-pixels is completed, VCD vacuum drying may be performed uniformly, and then baking is performed. The inkjet printing sequence of the hole injection layer 200 of the three sub-pixels can be changed without strict limitation.

Of course, it should be appreciated that, according to structural differences, when different inks are used for the first hole injection layer 210, the second hole injection layer 220 and the third hole injection layer 230, when the subsequent treating conditions (such as baking temperature) with different inks are different, the specific production process can also be as follows.

The first hole injection layer 210 in the first sub-pixel is printed by inkjet printing, and vacuum drying and baking of the first hole injection layer 210 are performed, and the baking temperature is the first temperature.

The second hole injection layer 220 in the second sub-pixel is printed by inkjet printing, and vacuum drying and baking of the second hole injection layer 220 are performed, and the baking temperature is the second temperature.

The third hole injection layer 230 in the third sub-pixel is printed by inkjet printing, and vacuum drying and baking of the third hole injection layer 230 are performed, and the baking temperature is the third temperature.

The first temperature is greater than the second temperature, and the second temperature is greater than the third temperature.

In other words, forming of the first hole injection layer 210, the second hole injection layer 220 and the third hole injection layer 230 can be adjusted according to the high or low of baking temperature of the ink, the first hole injection layer 210 with high baking temperature is printed first, and after the printing is completed, VCD vacuum treatment and high temperature baking are performed; after that, the second hole injection layer 220 with the next high baking temperature is printed, and the VCD vacuum treatment and baking treatment are performed; finally, the third hole injection layer 230 with the lowest baking temperature is printed, and corresponding VCD vacuum treatment and baking treatment are performed.

In addition, exemplary, the forming process of the hole transport layer 300 may be as follows.

The first hole transport layer 310 in the first sub-pixel, the second hole transport layer 320 in the second sub-pixel and the third hole transport layer 330 in the third sub-pixel are printed in sequence by inkjet printing, wherein the first hole transport layer 310, the second hole transport layer 320 and the third hole transport layer 330 are printed with the same ink or different inks; and vacuum drying and baking treatment are performed for the first hole transport layer 310, the second hole transport layer 320 and the third hole transport layer 330 after the inkjet printing is completed.

In the above solution, the same ink can be used for the first hole transport layer 310, the second hole transport layer 320 and the third hole transport layer 330, alternatively, different inks can be selected according to structural differences and the subsequent treating conditions (such as baking temperature) of different inks are the same. After full-screen inkjet printing of the three sub-pixels is completed, VCD vacuum drying can be performed uniformly, and then baking is performed. The inkjet printing sequence of the hole transport layer 300 of the three sub-pixels can be changed without strict limitation.

Of course, it should be appreciated that, according to structural differences, when different inks are used for the first hole transport layer 310, the second hole transport layer 320 and the third hole transport layer 330, when the subsequent treating conditions (such as baking temperature) with different inks are different, the specific production process can also be as follows.

The first hole transport layer 310 in the first sub-pixel is printed by inkjet printing, and vacuum drying and baking of the first hole transport layer 310 are performed, and the baking temperature is the fourth temperature.

The second hole transport layer 320 in the second sub-pixel is printed by inkjet printing, and vacuum drying and baking of the second hole transport layer 320 are performed, and the baking temperature is the fifth temperature.

The third hole transport layer 330 in the third sub-pixel is printed by inkjet printing, and vacuum drying and baking of the third hole transport layer 330 are performed, and the baking temperature is the sixth temperature.

The fourth temperature is higher than the fifth temperature, and the fifth temperature is higher than the sixth temperature.

In other words, forming of the first hole transport layer 310, the second hole transport layer 320 and the third hole transport layer 330 can be adjusted according to the high or low of baking temperature of the ink, the first hole transport layer 310 with high baking temperature is printed first, and after the printing is completed, VCD vacuum treatment and high temperature baking are performed; after that, the second hole transport layer 320 with the next high baking temperature is printed, and the VCD vacuum treatment and baking treatment are performed; finally, the third hole transport layer 330 with the lowest baking temperature is printed, and corresponding VCD vacuum treatment and baking treatment are performed.

Specifically, the manufacturing process of the light-emitting material layer 400 may be as follows.

The first light-emitting material layer 410 in the first sub-pixel, the second light-emitting material layer 420 in the second sub-pixel, the third light-emitting material layer 430 in the third sub-pixel are printed in sequence by inkjet printing, wherein the first light-emitting material layer 410, the second light-emitting material layer 420 and the third light-emitting material layer 430 are printed with the same ink or different inks; and vacuum drying and baking treatments are performed on the first light-emitting material layer 410, the second light-emitting material layer 420 and the third light-emitting material layer 430 after inkjet printing is completed.

In the above solution, the same ink can be used for the first light-emitting material layer 410, the second light-emitting material layer 420 and the third light-emitting material layer 430, alternatively, different inks can be selected according to structural differences and the subsequent treating conditions (such as baking temperature) of different inks are the same. After full-screen inkjet printing of the three sub-pixels is completed, VCD vacuum drying can be performed uniformly, and then baking is performed. The inkjet printing sequence of the light-emitting material layer 400 of the three sub-pixels can be changed without strict limitation.

Of course, it should be appreciated that, according to structural differences, when different inks are used for the first light-emitting material layer 410, the second light-emitting material layer 420 and the third light-emitting material layer 430, when the subsequent treating conditions (such as baking temperature) with different inks are different, the specific production process can further be as follows.

The first light-emitting material layer 410 in the first sub-pixel is printed by inkjet printing, and vacuum drying and baking of the first light-emitting material layer 410 are performed, and the baking temperature is the fourth temperature.

The second light-emitting material layer 420 in the second sub-pixel is printed by inkjet printing, and vacuum drying and baking of the second light-emitting material layer 420 are performed, and the baking temperature is the fifth temperature.

The third light-emitting material layer 430 in the third sub-pixel is printed by inkjet printing, and vacuum drying and baking of the third light-emitting material layer 430 are performed, and the baking temperature is the sixth temperature.

The fourth temperature is higher than the fifth temperature, and the fifth temperature is higher than the sixth temperature.

In other words, forming of the first light-emitting material layer 410, the second light-emitting material layer 420 and the third light-emitting material layer 430 can be adjusted according to the high or low of baking temperature of the ink, the first light-emitting material layer 410 with high baking temperature is printed first, and after the printing is completed, VCD vacuum treatment and high temperature baking are performed; after that, the second light-emitting material layer 420 with the next high baking temperature is printed, and the VCD vacuum treatment and baking treatment are performed; finally, the third light-emitting material layer 430 with the lowest baking temperature is printed, and corresponding VCD vacuum treatment and baking treatment are performed.

Specifically, the electron transport layer 500 and the electron injection layer 600 may be formed by an evaporation process.

In addition, the cathode layer 700 can be specifically formed by an evaporation process, and a metal film, such as an Ag or Ag/Mg film layer, can be selected.

The following points need to be noted:

(1) The drawings of the embodiments of the present disclosure only relate to the structures involved in the embodiments of the present disclosure, and other structures may refer to general designs.

(2) In the drawings for describing the embodiments of the present disclosure, the thicknesses of layers or regions are exaggerated or reduced for clarity, that is, the drawings are not drawn on an actual scale. It will be understood that when an element such as the layer, film, region or substrate is referred to as being "on" or "under" another element, the element may be "directly" "on" or "under" another element or intervening elements may be present.

(3) In the absence of conflict, the embodiments of the present disclosure and the features in the embodiments may be combined with each other to obtain new embodiments.

The above are only specific embodiments of the present disclosure, but the protection scope of the present disclosure is not limited thereto, and the protection scope of the present disclosure should be subject to the protection scope of the claims.

What is claimed is:

1. A display device, comprising an anode layer, a hole injection layer, a hole transport layer, a light-emitting material layer, an electron transport layer, an electron injection layer, and a cathode layer arranged in sequence;
wherein the electron injection layer comprises at least one electron injection layer, and at least one high impedance layer is further arranged between at least one of the electron injection layers and the cathode layer, a resistivity of the electron injection layer and a resistivity of the cathode layer are both smaller than a resistivity of the high impedance layer.

2. The display device of claim 1, wherein
the electron injection layer comprises M layers of the electron injection layer and the high impedance layer comprises N layers of the high impedance layer, both M and N are positive integers greater than or equal to 1, and the M layers of the electron injection layer and the N layers of the high impedance layer are alternately arranged.

3. The display device of claim 2, wherein
both M and N are greater than or equal to 2 and less than or equal to 10.

4. The display device of claim 1, wherein
the anode layer is an oxide conductive layer, and the cathode layer is a metal film and/or an oxide conductive layer.

5. The display device of claim 4, wherein
the anode layer is an indium tin oxide film or an indium zinc oxide film, and the cathode layer is the metal film.

6. The display device of claim 4, wherein
the anode layer is an indium tin oxide film, and the cathode layer is an indium zinc oxide film.

7. The display device of claim 4, wherein
the anode layer is an indium tin oxide film, the cathode layer comprises a first cathode layer and a second cathode layer arranged on a side of the first cathode layer away from the anode layer, the first cathode layer is the metal film, the second cathode layer is an indium zinc oxide film, and the high impedance layer is arranged between the light-emitting material layer and the first cathode layer.

8. The display device of claim 4, wherein
the anode layer is an indium tin oxide film, the cathode layer comprises a first cathode layer and a second cathode layer arranged on a side of the first cathode layer away from the anode layer, the first cathode layer is the metal film, the second cathode layer is an indium zinc oxide film, and the high impedance layer is arranged between the first cathode layer and the second cathode layer.

9. The display device of claim 1, wherein
a value range of the resistivity of the high impedance layer is $1.0 \times 10^5$ Ω·cm~$9.0 \times 10^6$ Ω·cm.

10. The display device of claim 1, wherein
a value range of a film thickness of the high impedance layer is 60~690 nm.

11. The display device of claim 1, wherein
an absolute value range of a work function of the high impedance layer is 3.6 eV~4.5 eV.

12. The display device of claim 1, wherein
a value range of the resistivity of the electron injection layer is $1.0 \times 10^5$ Ω·cm~$9.0 \times 10^5$ Ω·cm.

13. The display device of claim 1, wherein
an absolute value range of a work function of the electron injection layer is 2.6~4.3 eV.

14. The display device of claim 1, wherein
a material of the high impedance layer is selected from at least one of zinc oxide, titanium oxide, tin oxide and indium oxide.

15. The display device of claim 1, wherein
the anode layer comprises a reflective anode layer and a transparent anode layer, and the reflective anode layer is arranged on a side of the transparent anode layer away from the cathode layer.

16. The display device of claim 1, wherein
the high impedance layer is an amorphous film, with a refractive index of 1.7~2.5, an absorption coefficient lower than 0.02, and a stress of −200~0 MPa.

17. The display device of claim 1, wherein
the hole transport layer comprises a p-type organic semiconductor material, which is an ink prepared using an aromatic amine compound, and comprises one or a mixture of two selected from materials as follows and materials obtained by changing and optimizing a substituent of the materials as follows:

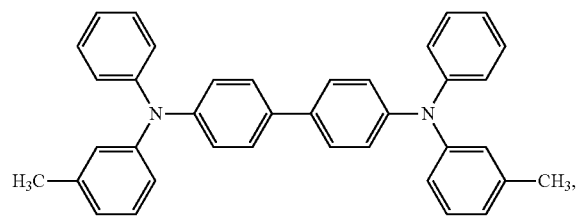

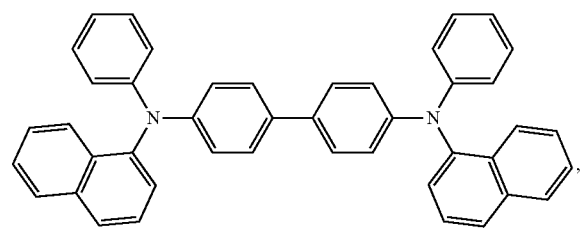

-continued
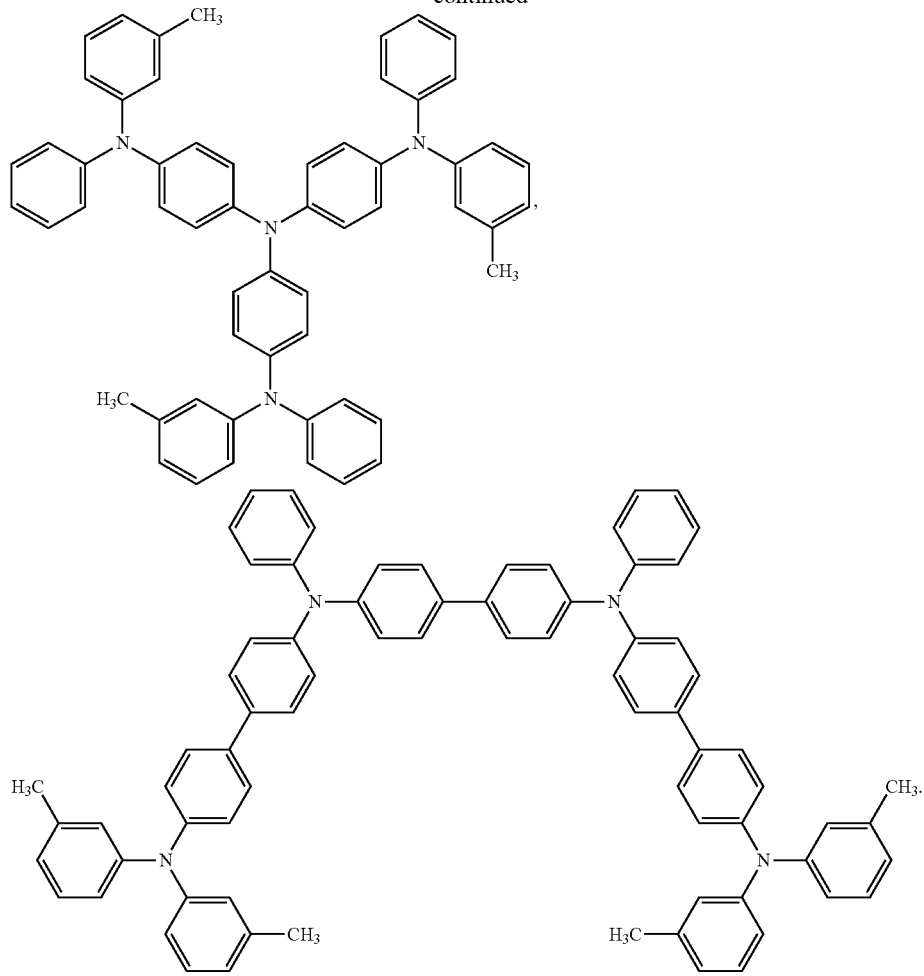
TPTE
18. The display device of claim 1, wherein
the electron injection layer comprises an n-type organic semiconductor material, which comprises one or a mixture of two selected from materials as follows and materials obtained by changing and optimizing a substituent of the materials as follows:
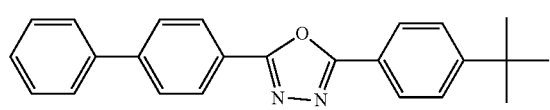
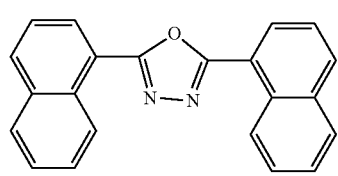
-continued
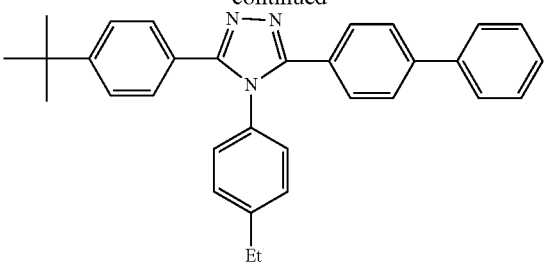
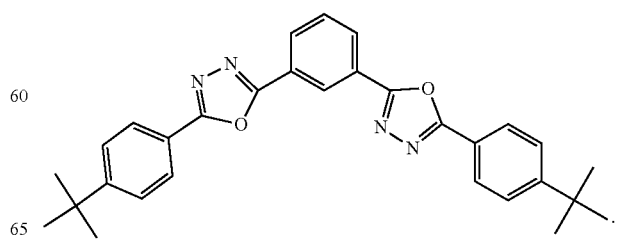

19. A method for manufacturing the display device of claim 1, comprising the following steps:
providing a base substrate; and
forming the anode layer, the hole injection layer, the hole transport layer, the light-emitting material layer, the electron transport layer, the electron injection layer, the high impedance layer and the cathode layer in sequence on the base substrate, wherein at least one electron injection layer is arranged, at least one high impedance layer is further arranged between at least one of the electron injection layers and the cathode layer, and the resistivity of the electron injection layer and the resistivity of the cathode layer are both smaller than the resistivity of the high impedance layer.

20. The method for manufacturing a display device of claim 19, wherein
the high impedance layer is formed by sputtering, and a sputtering gas used in the sputtering is oxygen gas and argon gas, and a proportion of the oxygen gas in the sputtering gas is less than or equal to 10%.

21. The method for manufacturing a display device of claim 20, wherein
the display device comprises a plurality of pixel units, the pixel units comprise a first sub-pixel, a second sub-pixel and a third sub-pixel;
forming the hole injection layer comprises the following steps:
printing a first hole injection layer in the first sub-pixel, a second hole injection layer in the second sub-pixel, a third hole injection layer in the third sub-pixel in sequence by inkjet printing, wherein the first hole injection layer, the second hole injection layer and the third hole injection layer are printed with the same ink or different inks; and performing vacuum drying and baking treatments on the first hole injection layer, the second hole injection layer and the third hole injection layer after the inkjet printing is completed;
or
printing a first hole injection layer arranged in the first sub-pixel by inkjet printing, and performing vacuum drying and baking treatments on the first hole injection layer, of which a baking temperature is a first temperature;
print a second hole injection layer arranged in the second sub-pixel by inkjet printing, and performing the vacuum drying and baking treatments on the second hole injection layer, of which a baking temperature is a second temperature;
printing a third hole injection layer arranged in the third sub-pixel by inkjet printing, and performing the vacuum drying and baking treatments on the third hole injection layer, of which a baking temperature is a third temperature;
wherein the first hole injection layer, the second hole injection layer and the third hole injection layer are printed with different inks, and the first temperature is higher than the second temperature, and the second temperature is higher than the third temperature.

22. The method for manufacturing a display device of claim 20, wherein
the display device comprises a plurality of pixel units, the pixel units comprise a first sub-pixel, a second sub-pixel and a third sub-pixel;
forming the hole transport layer comprises the following steps:
printing a first hole transport layer in the first sub-pixel, a second hole transport layer in the second sub-pixel and a third hole transport layer in the third sub-pixel in sequence by inkjet printing, wherein the first hole transport layer, the second hole transport layer and the third hole transport layer are printed with the same ink or different inks; and performing vacuum drying and baking treatments on the first hole transport layer, the second hole transport layer and the third hole transport layer after the inkjet printing is completed;
or
printing a first hole transport layer arranged in the first sub-pixel by inkjet printing, and performing vacuum drying and baking treatments on the first hole transport layer, of which a baking temperature is a fourth temperature;
printing a second hole transport layer arranged in the second sub-pixel by inkjet printing, and performing the vacuum drying and baking treatments on the second hole transport layer, of which a baking temperature is a fifth temperature;
printing a third hole transport layer arranged in the third sub-pixel by inkjet printing, and performing the vacuum drying and baking treatments on the third hole transport layer, of which a baking temperature is a sixth temperature;
wherein the first hole transport layer, the second hole transport layer and the third hole transport layer are printed with different inks, the fourth temperature is higher than the fifth temperature, and the fifth temperature is higher than the sixth temperature.

23. The method for manufacturing a display device of claim 20, wherein
the display device comprises a plurality of pixel units, the pixel units comprise a first sub-pixel, a second sub-pixel and a third sub-pixel;
forming the light-emitting material layer comprises the following steps:
printing a first light-emitting material layer in the first sub-pixel, a second light-emitting material layer in the second sub-pixel and a third light-emitting material layer in the third sub-pixel in sequence by inkjet printing, wherein the first light-emitting material layer, the second light-emitting material layer and the third light-emitting material layer are printed with the same ink or different inks; and performing vacuum drying and baking treatments on the first light-emitting material layer, the second light-emitting material layer and the third light-emitting material layer after the inkjet printing is completed;
or
printing a first light-emitting material layer arranged in the first sub-pixel by inkjet printing, and performing vacuum drying and baking treatments on the first light-emitting material layer, of which a baking temperature is a seventh temperature;
printing a second light-emitting material layer arranged in the second sub-pixel by inkjet printing, and performing the vacuum drying and baking treatments on the second light-emitting material layer, of which a baking temperature is a eighth temperature;
printing a third light-emitting material layer arranged in the third sub-pixel by inkjet printing, and performing the vacuum drying and baking treatments on the third light-emitting material layer, of which a baking temperature is a ninth temperature;
wherein the first light-emitting material layer, the second light-emitting material layer and the third light-emitting material layer are printed with different inks, the seventh temperature is higher than the eighth temperature, and the eighth temperature is higher than the ninth temperature.

\* \* \* \* \*